United States Patent
Jeong et al.

(10) Patent No.: US 7,876,636 B2
(45) Date of Patent: Jan. 25, 2011

(54) SEMICONDUCTOR MEMORY DEVICE AND METHOD FOR DRIVING THE SAME

(75) Inventors: Chun-Seok Jeong, Kyoungki-do (KR); Kee-Teok Park, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 81 days.

(21) Appl. No.: 11/819,788

(22) Filed: Jun. 29, 2007

(65) Prior Publication Data

US 2008/0159038 A1 Jul. 3, 2008

(30) Foreign Application Priority Data

Jan. 3, 2007 (KR) .................... 10-2007-0000399

(51) Int. Cl.
G11C 7/00 (2006.01)
G11C 7/04 (2006.01)

(52) U.S. Cl. .................. 365/222; 365/211; 365/189.05; 365/189.08

(58) Field of Classification Search ................. 365/222, 365/211, 189.05, 189.08
See application file for complete search history.

(56) References Cited

U.S. PATENT DOCUMENTS

| | | | |
|---|---|---|---|
| 6,438,055 B1 * | 8/2002 | Taguchi et al. | 365/222 |
| 6,721,225 B2 * | 4/2004 | Tsukude | 365/222 |
| 6,879,536 B2 * | 4/2005 | Lee | 365/222 |
| 6,999,368 B2 * | 2/2006 | Fujimoto et al. | 365/222 |
| 7,038,968 B2 | 5/2006 | Kim | |
| 7,120,761 B2 * | 10/2006 | Matsuzaki et al. | 365/222 |
| 7,154,799 B2 * | 12/2006 | Matsuzaki | 365/222 |
| 7,248,528 B2 * | 7/2007 | Riho et al. | 365/222 |
| 7,260,009 B2 * | 8/2007 | Origasa | 365/222 |
| 7,292,490 B1 * | 11/2007 | Shu et al. | 365/222 |
| 7,327,631 B2 * | 2/2008 | Kim | 365/229 |
| 7,362,640 B2 * | 4/2008 | Oh | 365/222 |
| 7,369,451 B2 * | 5/2008 | Oh | 365/222 |
| 7,447,098 B2 * | 11/2008 | Tsukude | 365/222 |

(Continued)

FOREIGN PATENT DOCUMENTS

KR 10-0200723 B1 3/1999

(Continued)

OTHER PUBLICATIONS

Korean Notice of Allowance, issued in Korean Patent Application No. KR 10-2007-0000399, filed on May 14, 2008.

(Continued)

*Primary Examiner*—Trong Phan
(74) *Attorney, Agent, or Firm*—IP & T Group LLP

(57) ABSTRACT

A semiconductor memory device performs a refresh operation stably even while a temperature continuously changes at near a specific temperature. The semiconductor memory device includes an on die thermal sensor (ODTS) and a control signal generator. The on die thermal sensor (ODTS) outputs a thermal code corresponding to a temperature of the semiconductor memory device. The control signal generator generates a self refresh control signal in response to the thermal code, wherein a state of the self refresh control signal does not change when the temperature variation is less than a predetermined value.

5 Claims, 4 Drawing Sheets

U.S. PATENT DOCUMENTS

| | | |
|---|---|---|
| 2005/0105352 A1 | 5/2005 | Lee |
| 2005/0228611 A1 | 10/2005 | Kim |
| 2006/0066386 A1 | 3/2006 | Hong |
| 2006/0087901 A1 | 4/2006 | Hong et al. |

FOREIGN PATENT DOCUMENTS

| | | |
|---|---|---|
| KR | 10-2001-0004581 A | 1/2001 |
| KR | 10-2004-0088913 | 10/2004 |
| KR | 10-2005-0033123 A | 4/2005 |
| KR | 10-2005-0033913 A | 4/2005 |
| KR | 10-2005-0067520 A | 7/2005 |
| KR | 10-2005-0072840 A | 7/2005 |
| KR | 10-2005-0082579 | 8/2005 |
| KR | 10-2005-0118952 A | 12/2005 |
| KR | 10-2006-0084572 A | 7/2006 |

OTHER PUBLICATIONS

Korean Office Action, with English translation, issued in Korean Patent Application No. KR 10-2007-0000399, mailed Feb. 20, 2008.

* cited by examiner

SEMICONDUCTOR MEMORY DEVICE AND METHOD FOR DRIVING THE SAME

CROSS-REFERENCE TO RELATED APPLICATIONS

The present invention claims priority of Korean patent application no. 10-2007-0000399, filed in Korean Patent Office on Jan. 3, 2007, which is incorporated by reference in its entirety.

BACKGROUND OF THE INVENTION

The present invention relates to a semiconductor memory device, and more particularly, to a self refresh operation of a semiconductor memory device.

In general, a memory cell in a semiconductor memory device is configured with a transistor acting as a switch and a capacitor storing charges (data) therein. Depending on whether charges are stored in the capacitor of the memory cell, i.e., depending on whether a terminal voltage of the capacitor is high or low, data value is determined as 'HIGH' (logic 1) or 'LOW' (logic 0).

Since data retention is a state that charges are accumulated in the capacitor, there is no power consumption in principle. However, charges, which are initially stored, may disappear due to leakage current caused by a PN junction of a metal oxide semiconductor (MOS) transistor, which may lead to data loss. To prevent the data loss, data in the memory cell are read before the data are lost, and charges must be then recharged according to the read data.

Data can be retained through periodic repetition of such operation. This recharging process of cell charges is referred to as a refresh operation. Thus, a semiconductor memory device consumes refresh power due to this refresh operation. It is very important to reduce power consumption in a battery-operated system requiring low-power performance, which is a critical issue.

One of various attempts to reduce power consumption in the refresh operation is to change a refresh period according to temperature. In the semiconductor memory device, data retention time becomes longer as the temperature becomes lower. Therefore, the power consumption can be reduced by dividing a temperature range into a plurality of sub-ranges and relatively reducing a refresh clock frequency at a low temperature range. Thus, an internal temperature of the semiconductor memory device is detected, and a self refresh period is adjusted such that the semiconductor memory device itself performs the refresh operation according to the detected temperature.

FIG. 1 is a block diagram illustrating an on die thermal sensor (ODTS), a control signal generator, and a self refresh oscillator of a conventional semiconductor memory device.

The ODTS 15 detects an internal temperature of the semiconductor memory device to output a thermal code containing temperature information.

Specifically, a bandgap unit 10 detects a temperature using the fact that the change in a base-emitter voltage (VBE) of a bipolar junction transistor (BJT) is about −1.8 mV/° C. in bandgap circuits which are not influenced by the change of temperature or power supply voltage. The bandgap unit 10 outputs a first voltage VTEMP corresponding to the temperature by 1:1 by amplifying the finely changing base-emitter voltage (VBE) of the BJT. That is, as the temperature of the semiconductor device becomes higher, the bandgap unit 10 outputs a lower base-emitter voltage (VBE) of the BJT.

An analog-to-digital converter (ADC) 20 coverts the first voltage VTEMP in analog form outputted from the bandgap unit 10 to a thermal code in digital form. Generally, a tracking analog-to-digital converter is most widely used as the ADC 20.

The tracking ADC tracks the first voltage VTEMP using a second voltage in the tracking ADC itself to thereby generate the thermal code, which will be described below. First, voltage levels of the first voltage VTEMP and the second voltage are compared with each other, and the thermal code is increased or decreased according to the comparison result. At this point, the voltage level of the second voltage is also increased or decreased. The increased or decreased second voltage is compared with the first voltage VTEMP again. By repeating the above procedure, the second voltage tracks the first voltage VTEMP, and thus the thermal code corresponding to the first voltage VTEMP is generated.

In summary, when the bandgap unit 10 outputs the first voltage VTEMP containing temperature information, the ADC 20 converts the first voltage VTEMP to the thermal code containing temperature information.

The thermal code outputted from the ODTS 15 is transmitted to a control signal generator 30, and the control signal generator 30 then generates a self refresh control signal TRIP_POINT_FLAG. The self refresh control signal TRIP_POINT_FLAG includes flag signals which are activated at a predetermined temperature or higher. Referring to FIG. 2, as temperature increases, a TEMPA signal is activated first, and thereafter TEMPB and TEMPC signals are respectively activated at corresponding detection temperatures in sequence.

The self refresh control signal TRIP_POINT_FLAG, which contains the TEMPA, TEMPB and TEMPC signals, indicates the temperature of the semiconductor memory device. When the TEMPA, TEMPB and TEMPC signals are all logic low levels, the semiconductor memory device is in the, lowest temperature range. When the TEMPA signal is a logic high level but both the TEMPB and TEMPC signals are logic low levels, the semiconductor memory device is in the second lowest temperature range. When the TEMPA, TEMPB and TEMPC signals are all logic high levels, the semiconductor memory device is in the highest temperature range. That is, the self refresh control signal TRIP_POINT_FLAG containing the TEMPA, TEMPB and TEMPC signals indicates which temperature range the semiconductor memory device is in. The self refresh control signal TRIP_POINT_FLAG containing the TEMPA, TEMPB and TEMPC signals is illustrated in FIG. 2.

A self refresh oscillator 40 receives the self refresh control signal TRIP_POINT_FLAG to generate an oscillating periodic wave OSC, thereby controlling a self refresh period of the semiconductor memory device. As described above, since a data retention time in a memory cell of the semiconductor memory device decreases as the temperature increases, the self refresh period becomes shorter as the temperature is higher.

The self refresh period controlled by the self refresh oscillator 40 will be more fully illustrated with reference to FIG. 2. The self refresh period increases by 5% in a section (5% inc) where the TEMPA is a logic high level and both the TEMPB and TEMPC signals are logic low levels, based on the self refresh period of a section ($1x$) where the TEMPA and TEMPB signals are logic high levels and the TEMPC is a logic low level. Furthermore, the self refresh period increases by 15% in a section (15% inc) where the TEMPA, TEMPB and TEMPC signals are all logic low levels. On the contrary, the self refresh period decreases by half in a section ($2x$) where the TEMPA, TEMB and TEMPC signals are all logic high levels, i.e., a section where the semiconductor memory device is in high temperature range. Herein, the reference symbol '2x' means that the self refresh period is reduced to half so that the self refresh operation is performed two times more in the high temperature section (2x) than the normal section (1x).

To summarize overall operation, the ODTS 15 measures the internal temperature of the semiconductor memory device to output the thermal code, and the control signal generator 30 then outputs the self refresh control signal TRIP_POINT_FLAG containing the TEMPA, TEMPB, TEMPC signals and the like, which indicate corresponding temperature ranges. The self refresh oscillator 40 controls the self refresh period of the semiconductor memory device depending on the section indicated by the self refresh control signal TRIP_POINT_FLAG.

As described above, the semiconductor memory device controls its self refresh period according to the temperature variation. However, in case that the temperature continuously changes near a specific temperature, for example, in case that the temperature continuously changes near a temperature at which the TEMPC signal is activated, the self refresh period of the semiconductor memory device abruptly changes into the self refresh period corresponding to the sections 1x, 2x, etc, causing the unstable operation of the semiconductor memory device after all.

SUMMARY OF THE INVENTION

Embodiments of the present invention are directed to providing a semiconductor memory device that performs a refresh operation stably even while a temperature continuously changes at near a specific temperature.

In accordance with an aspect of the present invention, a semiconductor memory device includes an on die thermal sensor (ODTS) for outputting a thermal code corresponding to a temperature of the semiconductor memory device, and a control signal generator for generating a self refresh control signal in response to the thermal code, wherein a state of the self refresh control signal does not change when the temperature variation is less than a predetermined value.

In accordance with another aspect of the present invention, a method for generating a self refresh control signal of a semiconductor memory device includes measuring a temperature of the semiconductor memory device to generate a thermal code, generating a first flag signal enabled at a predetermined temperature or higher using the thermal code, generating a second flag signal enabled at a temperature that is different from the predetermined temperature by a specific value or higher using the thermal code, and generating the self refresh control signal enabled in response to the first and second flag signals, wherein a state of the self refresh control signal does not change when one of the first and second flag signals is enabled and the other is disabled.

DESCRIPTION OF SPECIFIC EMBODIMENTS

Hereinafter, a semiconductor memory device performing stable self refresh operation and a method for generating a self refresh control signal in accordance with the present invention will be described in detail with reference to the accompanying drawings.

Figure 3:
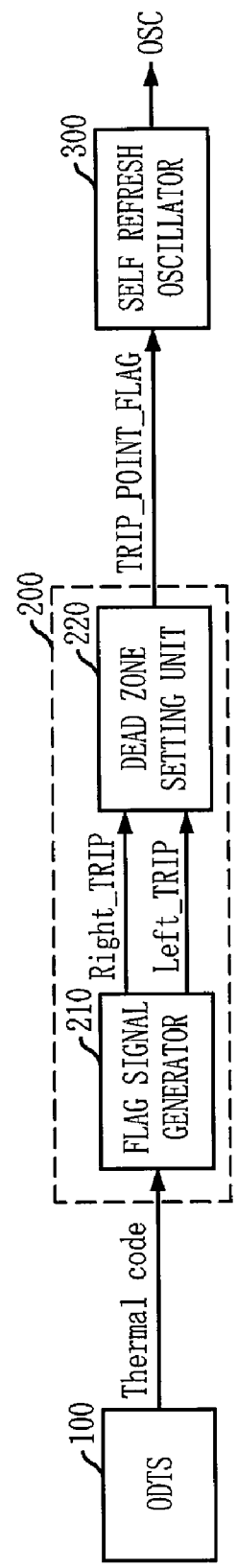
FIG. 3 is a block diagram illustrating a semiconductor memory device performing a stable self refresh operation in accordance with an embodiment of the present invention.

FIG. 3 is a block diagram illustrating a semiconductor memory device performing a stable self refresh operation in accordance with an embodiment of the present invention.

Referring to FIG. 3, the semiconductor memory device in accordance with the embodiment of the present invention includes an on die thermal sensor (ODTS) 100, a control signal generator 200, and a self refresh oscillator 300.

The ODTS 100 measures a temperature of a semiconductor memory device to output a thermal code. The ODTS 100, however, is not a newly added element and has been already illustrated in detail in the background of the invention. Thus, further description for the ODTS will be omitted herein.

The control signal generator 200 receives the thermal code from the ODTS 100 to generate a self refresh control signal TRIP_POINT_FLAG indicating a temperature range of the semiconductor memory device. In the control signal generator 200 of the present invention, a dead zone is formed such that a state of the self refresh control signal TRIP_POINT_FLAG is not changed when a temperature variation is less than a predetermined value in generating the self refresh control signal TRIP_POINT_FLAG. Therefore, it is possible to prevent the self refresh period of the semiconductor memory device from changing frequently.

In detail, the control signal generator 200 may include a flag signal generator 210 and a dead zone setting unit 220.

The flag signal generator 210 generates a first flag signal RIGHT_TRIP activated at a predetermined temperature or higher, and a second flag signal LEFT_TRIP activated at a temperature that is different from the predetermined temperature by a specific value or higher.

Figure 4:
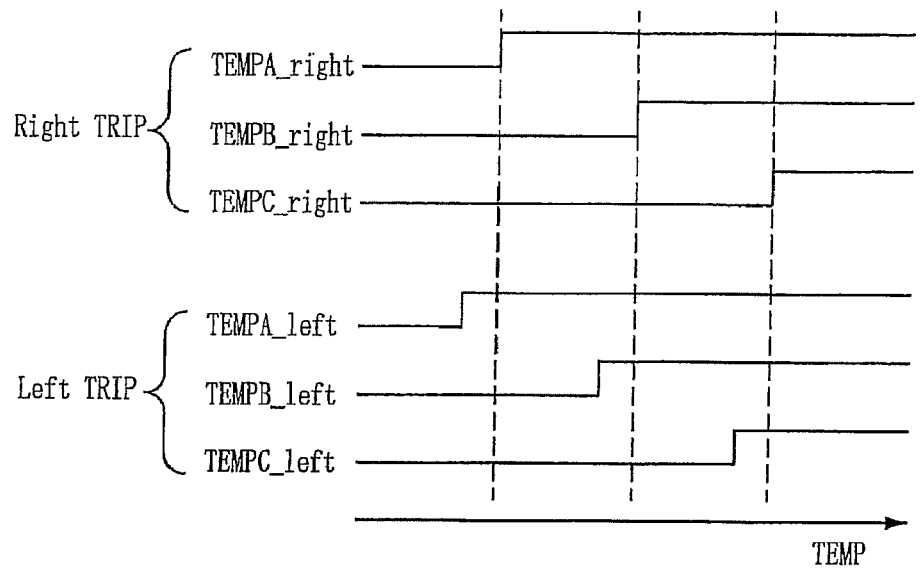
FIG. 4 is a timing diagram illustrating a first flag signal and a second flag signal.

The first flag signal RIGHT_TRIP is the same as the conventional self refresh control signal. The second flag signal LEFT_TRIP is generated at a temperature that is different from the first flag signal RIGHT_TRIP by a specific value (e.g., 3° C.). For easy understanding, the first flag signal RIGHT_TRIP and the second flag signal LEFT_TRIP are illustrated in FIG. 4. Referring to FIG. 4, TEMPA_RIGHT, TEMPB_RIGHT, and TEMPC_RIGHT signals belong to the first flag signal RIGHT_TRIP, and TEMPA_LEFT, TEMPB_LEFT, and TEMPC_LEFT signals belong to the second flag signal LEFT_TRIP. As aforementioned, there is a difference between activation temperatures of the first and second flag signals RIGHT_TRIP and LEFT_TRIP.

Figure 1:
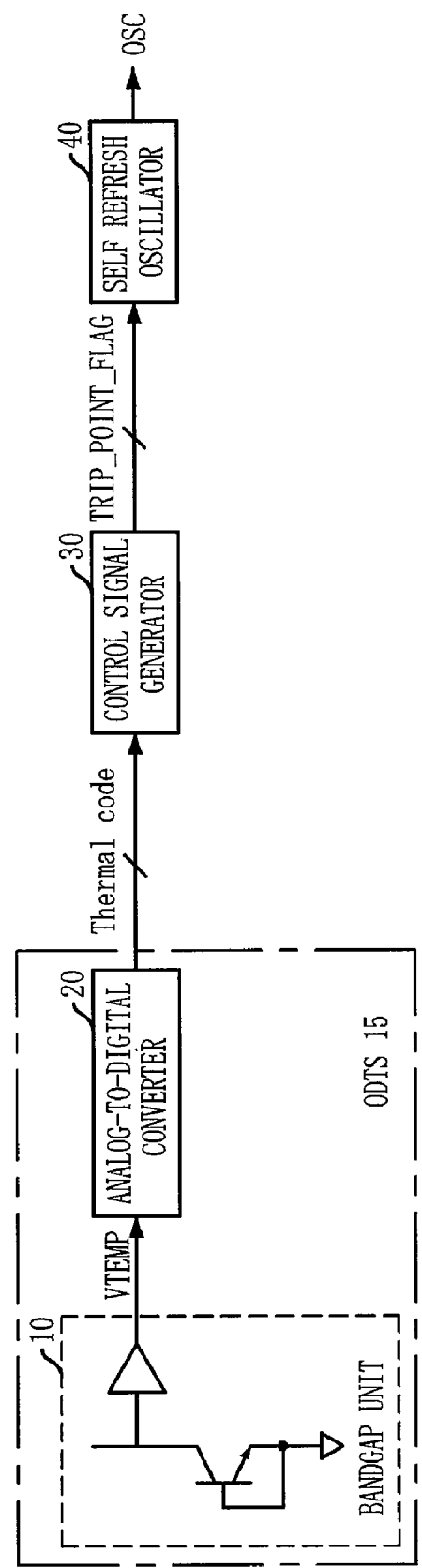
FIG. 1 is a block diagram illustrating an on die thermal sensor (ODTS), a control signal generator, and a self refresh oscillator of a conventional semiconductor memory device.
Figure 2:
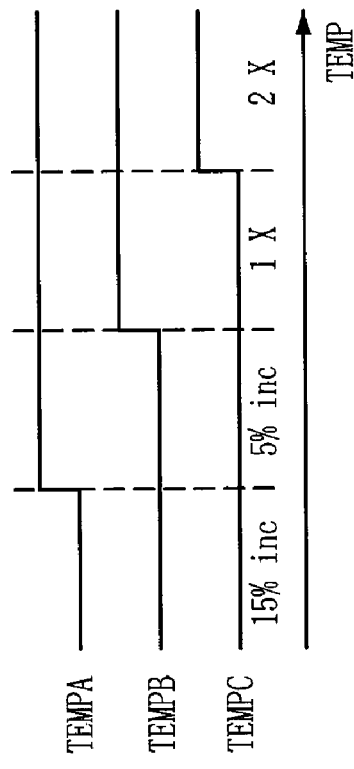
FIG. 2 is a timing diagram illustrating generation of a conventional self refresh control signal.

The flag signal generator 210 receives the thermal code to generate the flag signals activated at predetermined temperatures or higher, as similar to the conventional control signal generator (see 30 of FIG. 1). Therefore, the flag signal generator 210 may be configured in the same manner as the conventional control signal generator (see 30 of FIG. 1). However, the only difference is that the number of the flag signals is greater than twice that of the conventional flag signal because of the first and second flag signals RIGHT_TRIP and LEFT_TRIP.

The dead zone setting unit 220 are enabled according to the first and second flag signals RIGHT_TRIP and LEFT_TRIP to generate the self refresh control signal TRIP_POINT_FLAG having a dead zone, i.e., a section between the first and second flag signals RIGHT_TRIP and LEFT_TRIP, in which a state of the self refresh control signal TRIP_POINT_FLAG is not changed.

In detail, the self refresh control signal TRIP_POINT_FLAG is activated when both the first and second flag signals RIGHT_TRIP and LEFT_TRIP are activated. The self refresh control signal TRIP_POINT_FLAG which has been activated once is deactivated when both the first and second flag signals RIGHT_TRIP and LEFT_TRIP are deactivated.

Figure 5:
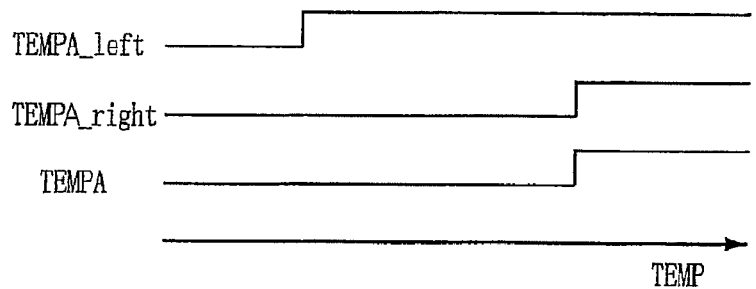
FIG. 5 is a timing diagram illustrating a self refresh control signal in a dead zone setting unit.
Figure 5:
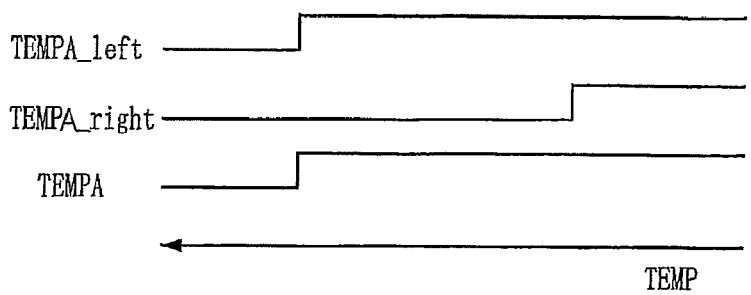

FIG. 5 illustrates how the self refresh control signal TRIP_POINT_FLAG is generated in the dead zone setting unit 220. Referring to FIG. 5, when the temperature increases, the self refresh control signal TRIP_POINT_FLAG (for instance, only TEMPA signal is shown) is activated in case that both the second flag signal LEFT_TRIP (for instance, only TEMPA_LEFT signal is shown) and the first flag signal RIGHT_TRIP (for instance, only TEMPA_RIGHT is shown) are activated. Contrariwise, when the temperature decreases, the self refresh control signal TRIP_POINT_FLAG is deactivated in case that both the first and second flag signals RIGHT_TRIP and LEFT_TRIP are deactivated. Therefore, since the self refresh control signal TRIP_POINT_FLAG does not change even though the internal temperature of the semiconductor memory device continuously changes between the first and second flag signals RIGHT_TRIP and the LEFT_TRIP, it is possible to overcome a problem in frequent change of the self refresh period.

The self refresh oscillator 300 receives the self refresh control signal TRIP_POINT_FLAG to control the self refresh period of the semiconductor memory device in each temperature range indicated by the self refresh control signal TRIP_POINT_FLAG.

The present invention is characterized in that the control signal generator 200 generates the self refresh control signal TRIP_POINT_FLAG indicating which temperature range the semiconductor memory device is in. Although the self refresh oscillator 300 controls the self refresh period of the semiconductor memory device, another component may control the self refresh period of the semiconductor memory device. Thus, even though another component controls the self refresh period instead of the self refresh oscillator 300, the present invention can be applied to every possible case of using the self refresh control signal TRIP_POINT_FLAG indicating the temperature range of the semiconductor memory device.

It will be illustrated below which temperature the dead zone has between the first and second flag signals RIGHT_TRIP and LEFT_TRIP.

The semiconductor memory device changes a refresh period 1x or 2x based on a refresh temperature at 85° C. However, an actual temperature determining 1x and 2x refresh operations is set to 83° C. internally due to a grace margin suggested by INTEL corporation in the past.

The grace margin is a margin temperature to secure an appropriate time for preparing an operation for temperature variation of the chip. For instance, when a system reads temperature information of 85° C., which is the present temperature, to prepare 2x refresh operation but the temperature increases to 87° C. in a short, time during preparation, an actually detected reference temperature at which the semiconductor memory device changes a refresh operation into 1x or 2x refresh operations becomes 87° C., which may lead to refresh fail occasionally.

Therefore, Joint Electron Device Engineering Council (JEDEC) has proposed that the semiconductor memory device performs 2x operation when the temperature reaches 83° C. to secure a time required for preparing the refresh operation.

Although the dead zone of the present invention, i.e., temperature variation smaller than a predetermined value, does not directly relate to the grace margin, but the dead zone must have at least the grace margin or greater.

In addition, when the dead zone is too great, an accuracy of the ODTS may be poor so that it is preferable to set the temperature of the dead zone to a range of 2° C. to 4° C. However, this temperature range can be adjusted according to design or process conditions.

Figure 6:
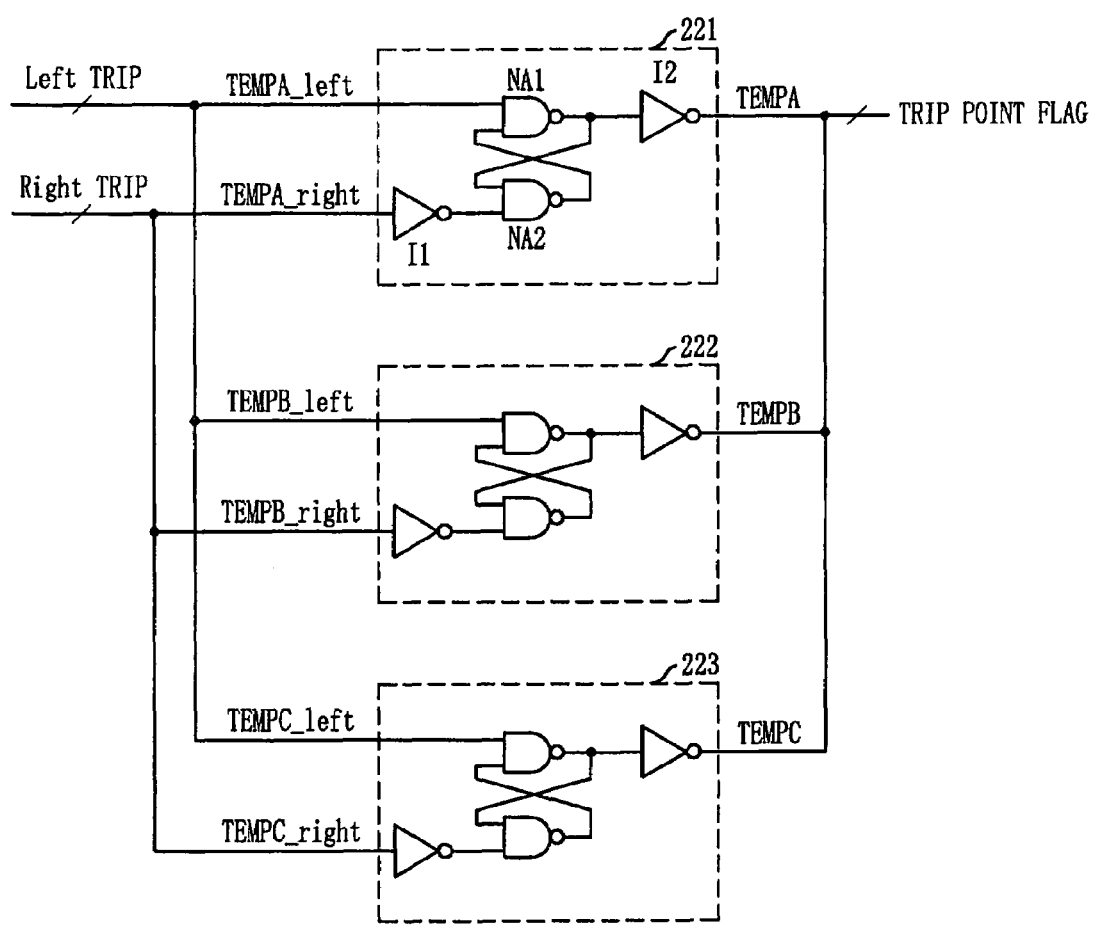
FIG. 6 is a circuit diagram illustrating the dead zone setting unit of FIG. 3.

FIG. 6 is a circuit diagram illustrating the dead zone setting unit of FIG. 3.

The dead zone setting unit may be configured with a set-reset (SR) latch circuit 221 receiving the first flag signal TEMPA_right and the second flag signal TEMPA_left.

In detail, the dead zone setting unit includes a first NAND gate for receiving the second flag signal, a second NAND gate for receiving an inverted signal of the first flag signal to constitute an SR latch with the first NAND gate, and an inverter for inverting the output of the first NAND gate to output the self refresh control signal. The dead zone setting unit has predetermined number of the SR latch circuits 221-223 corresponding to number of the first and second flag signals TEMPA_right-TEMPC_right and TEMPA_left-TEMPC_left. For example, FIG. 6 illustrates three SR latch circuits in case of using three self refresh control signals TEMPA, TEMPB and TEMPC.

As for the operation of generating the signal TEMPA of the self refresh control signals, the TEMPA signal becomes logic high level when both the TEMPA_LEFT signal and the TEMPA_RIGHT signal are at logic high levels. The TEMPA signal, which has been activated to logic high, is transited to logic low level when both the TEMPA_LEFT signal and the TEMPA_RIGHT signal become logic low levels. That is, the dead zone setting unit operates in the same manner as illustrated in FIG. 5.

A method for generating the self refresh control signal TRIP_POINT_FLAG in the semiconductor memory device will be illustrated with reference to FIG. 3 again. The method for generating the self refresh control signal TRIP_POINT_FLAG includes measuring a temperature of the semiconductor memory device to generate a thermal code; generating a first flag signal activated at a predetermined temperature or higher by using the thermal code; generating a second flag signal activated at a temperature that is different from the predetermined temperature by a specific value or higher using the thermal code; and generating the self refresh control signal activated in response to the first and second flag signals, wherein a state of the self refresh control signal is not changed in a section between the first and second flag signals.

In more detail, the self refresh control signal TRIP_POINT_FLAG is activated when both the first and second flag signals RIGHT_FLAG and LEFT_FLAG are activated. The first flag signal RIGHT_FLAG, which has been activated once, is deactivated when both the first and second flag signals RIGHT_FLAG and LEFT_FLAG are deactivated.

Furthermore, the present invention is characterized in that the self refresh control signal TRIP_POINT_FLAG is inputted into the self refresh oscillator 300 that controls the self refresh period.

In accordance with present invention as described above, it is possible to prevent the self refresh period from being abruptly changed to 1x, 2x or the like even when the temperature of the semiconductor memory device continuously changes near a specific temperature. Therefore, the semiconductor memory device can perform a stable refresh operation.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
a self refresh oscillator configured to control a self refresh period of the semiconductor memory device: and
a control signal generator configured to generate a first control signal and a second control signal, to generate a self refresh control signal in response to the first and second control signals, and to output the self refresh control signal to the self refresh oscillator,
wherein the first control signal is enabled in a first temperature range higher than a first temperature, the second control signal is enabled in a second temperature range higher than a second temperature, which is lower than the first temperature by a predetermined value, each control signal has one or more flag signals, and each flag signal is enabled at a predetermined temperature, and
wherein the self refresh control signal is enabled when a temperature increases and the first and second control signals are enabled, and the self refresh control signal is disabled when the temperature decreases and the first and second control signals are disabled.

2. The semiconductor memory device as recited in claim 1, wherein the control signal generator comprises:
a flag signal generator configured to generate the first and second control signals; and
a dead zone setting unit configured to set a dead zone of the self refresh control signal from an enable start period of the first control signal to an enable start period of the second control signal, in which a state of the self refresh control signal is not changed, and to output the self refresh control signal to the self refresh oscillator.

3. The semiconductor memory device as recited in claim 2, further comprising an on die thermal sensor (ODTS) configured to output a thermal code corresponding to a temperature of the semiconductor memory device to the flag signal generator.

4. The semiconductor memory device as recited in claim 1, wherein the dead zone setting unit includes a set-reset (SR) latch configured to receive the first and second control signals.

5. The semiconductor memory device as recited in claim 4, wherein the dead zone setting unit includes:
the SR latch; and
an inverter,
wherein the SR latch includes:
a first NAND gate configured to received the second control signal; and
a second NAND gate configured to receive an inverted signal of the first control signal, and
wherein the inverter is configured to invert an output of the first NAND gate to output the self refresh control signal.

* * * * *